(12) United States Patent
Bishop (10) Patent No.: US 8,297,788 B2
(45) Date of Patent: Oct. 30, 2012

(54) CARD EDGE LED STRIP CONNECTOR AND LED ASSEMBLY

(75) Inventor: Peter Bishop, Cambridgeshire (GB)

(73) Assignee: AVX Corporation, Fountain Inn, SC (US)

( * ) Notice: Subject to any disclaimer, the term of this patent is extended or adjusted under 35 U.S.C. 154(b) by 383 days.

(21) Appl. No.: 12/622,507

(22) Filed: Nov. 20, 2009

(65) Prior Publication Data

US 2010/0142204 A1    Jun. 10, 2010

Related U.S. Application Data

(60) Provisional application No. 61/120,706, filed on Dec. 8, 2008.

(51) Int. Cl.
*H01R 12/00* (2006.01)
*F21S 4/00* (2006.01)

(52) U.S. Cl. .......... 362/249.02; 362/219; 362/240; 439/631

(58) Field of Classification Search ............. 362/249.02, 362/219, 225, 240, 260, 238; 439/65, 631
See application file for complete search history.

(56) References Cited

U.S. PATENT DOCUMENTS

| | | | |
|---|---|---|---|
| 4,173,035 A * | 10/1979 | Hoyt | 362/249.04 |
| 4,999,755 A | 3/1991 | Lin | |
| 5,107,408 A * | 4/1992 | Vernondier | 362/238 |
| 5,466,174 A | 11/1995 | Savage, Jr. | |
| 5,781,414 A | 7/1998 | Mills et al. | |
| 5,848,837 A | 12/1998 | Gustafson | |
| 6,623,292 B1 | 9/2003 | Holler et al. | |
| 6,796,680 B1 * | 9/2004 | Showers et al. | 362/246 |
| 7,207,696 B1 | 4/2007 | Lin | |
| 7,547,214 B2 * | 6/2009 | Duesterhoeft et al. | 439/61 |
| 2004/0246714 A1 * | 12/2004 | Talamo et al. | 362/225 |
| 2005/0007033 A1 | 1/2005 | Kan et al. | |
| 2008/0094837 A1 | 4/2008 | Dobbins et al. | |
| 2010/0008090 A1 | 1/2010 | Li et al. | |
| 2010/0073929 A1 | 3/2010 | Gingrich, III | |

FOREIGN PATENT DOCUMENTS

| | | |
|---|---|---|
| DE | 10 2008 034 956 | 2/2010 |
| FR | 2 739 524 | 4/1997 |
| WO | WO 2005/106320 | 11/2005 |

OTHER PUBLICATIONS

Great Britain Search Report, May 13, 2010.

* cited by examiner

*Primary Examiner* — Peggy A. Neils
(74) *Attorney, Agent, or Firm* — Dority & Manning, P.A.

(57) ABSTRACT

An LED light assembly includes a plurality of LED printed circuit boards (PCB), with each LED PCB having at least one LED bulb and electrical connector pads configured at each opposite end of the boards. At least one electrical connector is configured to connect one end of a first LED PCB to an end of a second said LED PCB such that the first and second LED PCBs are electrically connected end-to-end. The connected LED PCBs may be configured in a light tube that includes connector end caps for mounting the light tube in a light fixture.

19 Claims, 5 Drawing Sheets

CARD EDGE LED STRIP CONNECTOR AND LED ASSEMBLY

BACKGROUND

The use of LED (Light Emitting Diode) lights is becoming increasingly popular in a wide variety of lighting applications. Significant advances have been made in LED lighting technology, which have made the use of LED lights more affordable and desirable in various industrial, household, and other environments requiring expanded lighting systems.

LED lights offer significant advantages over traditional incandescent lighting systems. With incandescent bulbs, the expense is not only the cost of replacement bulbs, but the labor and costs associated with frequent replacement of the bulbs. This expense can be significant where there are a large number of installed bulbs. For example, the maintenance costs to replace bulbs in large office buildings, public transportation vehicles and systems, and the like, can be quite high. These issues are substantially minimized with LED lighting systems.

The operational life of conventional white LED lamps is about 100,000 hours. This equates to about 11 years of continuous operation, or 22 years of 50% operation. This is in stark contrast to the average life of an incandescent bulb, which is approximately 5000 hours. It is thus readily appreciated that the use of LED lights virtually eliminates the need for routine bulb replacement. This advantage is even more important when the lighting device is embedded into a very inaccessible place.

It is generally recognized that, in a properly designed system, LED lights consume significantly less power than incandescent bulbs. An LED circuit has an efficiency of about 80%, which means 80% of the electrical energy is converted to light energy while the remaining 20% is lost as heat energy. In large lighting systems, the cost savings are enormous.

Unfortunately, due in part to the relatively high cost of LED lights, the art turned to fluorescent light bulbs and systems as an alternative to incandescent lights. Fluorescent lighting is about 66 percent cheaper than incandescent lighting while providing essentially the same brightness. Fluorescent lighting also lasts longer than conventional incandescent lighting. On average, a fluorescent tube has a lifespan six times longer than a regular incandescent bulb. A vast majority of commercial and industrial structures incorporate conventional fluorescent tube lighting fixtures, as do more recent residential structures. Fluorescent lighting fixtures are also used widely in public transportation systems and vehicles, trains, subway cars, planes, and so forth.

Fluorescent lights, however, have distinct disadvantages. Fluorescent lighting circuits are more complex than incandescent lighting and generally requires professional installation and expensive components. Fluorescent lighting is generally less attractive than incandescent lighting and can flicker noticeably and produce an uneven light that may bother some users. Mercury is an essential component in the manufacturing of fluorescent light tubes, and is considered hazardous by the U.S. Environmental Protection Agency due to its ability to bioaccumulate within the environment. The disposal of fluorescent light tubes is problematic for many municipalities, and a movement is underway in may locations to phase out the use of fluorescent lighting.

Increased reliance on LED lighting is thus a natural progression. However, the costs of replacing the existing fluorescent light tube fixtures and circuitry in existing structures, vehicles, systems, and so forth, is cost prohibitive. There is thus a need for a lighting system that can easily and affordably incorporate LED light devices in conventional fluorescent light fixtures. The present invention offers a unique solution to this need.

SUMMARY OF THE INVENTION

Objects and advantages of the invention will be set forth in part in the following description, or may be obvious from the description, or may be learned through practice of the invention.

In accordance with certain aspects of the invention, an LED light assembly is provided that includes a plurality of LED printed circuit boards (PCB), each of which has at least one LED bulb and electrical connector pads configured at each opposite end of the PCB. An electrical connector is disposed to electrically connect one end of a first LED PCB to an end of a second adjacent LED PCB.

The connector between the adjacent LED PCBs can take on various configurations. In a particularly unique embodiment, the electrical connector includes an insulative body having opposite aligned open ends. For example, the body may have an open-ended, box or channel-like shell configuration. At least two electrical contacts are held in the insulative body and are spaced apart a distance corresponding to a separation distance of the connector pads at the ends of the LED PCBs. It should be appreciated that any number of contacts may be configured in the body depending on the desired contact footprint. Each contact may be a blade-like member having a center beam and receipt channels extending in opposite directions from the center beam to the respective open ends of the insulative body. The receipt channels are defined between pairs of contact arms that extend transversely from the center beam and that are configured to electrically engage against the connector pads of an end of the LED PCB inserted into the open end of the insulative body.

The contacts may be retained in the insulative body of the connector in various ways. For example, in a unique embodiment, slots may be defined in the inner faces of the top and bottom sides of the insulative body, the slots having a width that corresponds essentially to the thickness of the contacts. The slots are open at one of the ends of the body so that the contacts are slidable into the slots at the respective end. The slots may be dead-ended at the opposite end so that the contacts cannot be pushed out of the slots. It may be desired with this embodiment to include an indication mark on an outer surface of the body shell that provides an indication of the respective longitudinal end having the open slots. When connecting adjacent LED PCBs, a first PCB should be inserted into the end of the connector having the open slots before inserting a PCB into the opposite end of the connector. Insertion of a PCB into the opposite end of the connector first might cause the contacts to be pushed out of the shell through the open end face of the slots.

The contacts may take on any desired shape and configuration that ensures reliable electrical contact with the contact pads on the LED PCBs. In one embodiment, the electrical contacts include barbs on the contact arms disposed to slide against the connector pads. The contact arms may be biased into the receipt channels, with the barbs further serving to allow for deflection of the contact arms upon insertion of the end of the LED PCB into the receipt channel.

It should be appreciated that the contacts may be retained in the insulative body by other suitable means. For example, the electrical contacts may be molded into the body.

The electrical connector between the LED PCBs allows for minimal spacing between the boards, and thus uniform spacing between the LED bulbs of adjacent boards. The center beam of the electrical contacts essentially defines the separation distance between the ends of adjacent LED PCBs. In a particular embodiment, the center beam has a longitudinal length of between 1 mm and 5 mm such that in an assembled state, the adjacent ends of the LED PCBs are spaced apart a minimal distance equal to between about 1 mm and 5 mm.

The present invention also encompasses an LED light tube assembly that is configured for receipt in a lighting fixture. This light tube assembly includes a light tube having an end cap connector at each opposite longitudinal end thereof. In this manner, the LED light tube assembly may resemble a conventional fluorescent light tube. A plurality of LED PCBs are connected in an end-to-end configuration within the light tube, with each of the LED PCBs having at least one LED bulb and electrical connector pads configured at each opposite end of the boards. The electrical connector pads on the extreme opposite ends of the connected boards are in electrical mating contact with the end cap connectors. As described above, an electrical connector connects the connector pads of aligned ends of adjacent LED PCBs within the light tube such that one end of a first LED PCB is in electrical contact to an end of a second LED PCB. In this manner, any desired number of LED PCBs can be connected in an end-to-end manner within the light tube. Thus, various sizes and power ratings of the light tube can be easily manufactured and assembled using a standard, single size LED PCB, end cap connectors, and board connectors. Only the length of the light tube would vary to accommodate the desired number of LED PCBs.

The LED light tube assembly is particularly unique in that it can be readily configured for receipt in an existing fluorescent light fixture. The end cap connectors would include pin contacts configured for receipt in receptacles in the fluorescent light fixture. Thus, the LED light tube can be a replacement bulb for existing fluorescent light fixtures.

The electrical connectors between the LED PCBs in the light tube assembly may be configured as described above.

The invention also encompasses an electrical connector configured for connecting adjacent ends of LED PCBs within a light tube, wherein the LED PCBs have at least one LED bulb and a plurality of electrical contact pads at each end of the board. This connector may have the unique configuration and advantages as described above, and presented in greater detail herein.

Aspects of the invention are presented below by reference to particular embodiments illustrated in the figures.

DETAILED DESCRIPTION

Reference will now be made in detail embodiments of the invention, examples of which are illustrated in the drawings. The various embodiments are presented herein for sake of explaining aspects of the invention, and should not be interpreted as a limitation of the invention. For example, features illustrated or described with respect to one embodiment can be used with another embodiment to yield still a further embodiment. It is intended that the present invention include these and other modifications and variations as come within the scope and spirit of the invention.

Figure 1A:
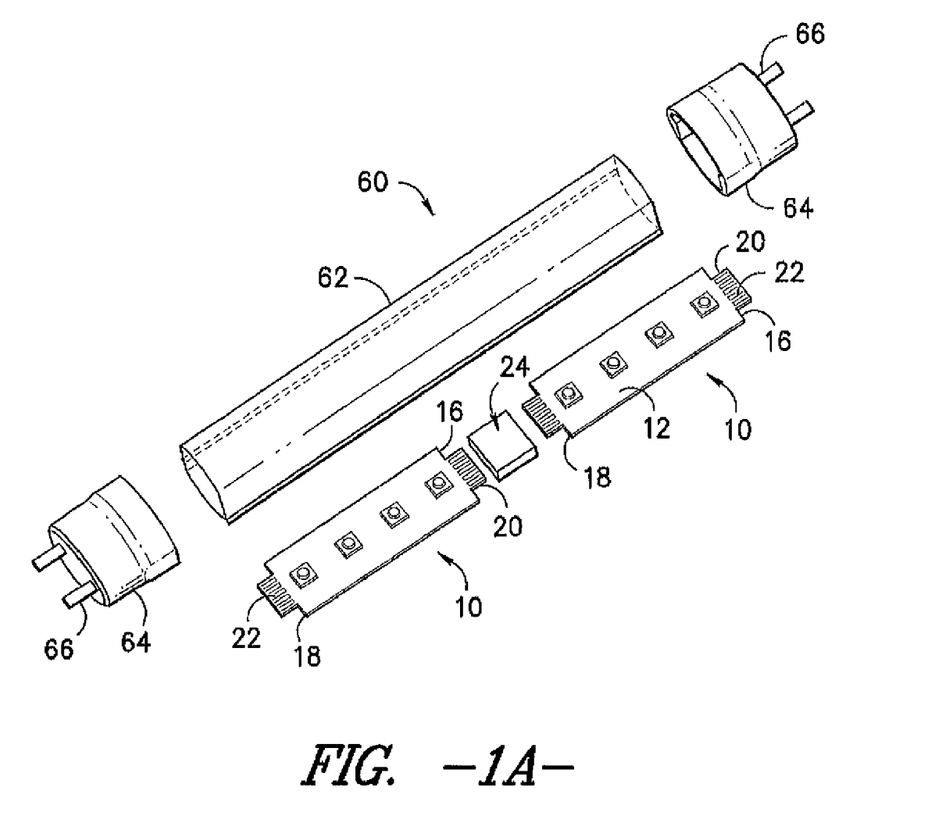
FIG. 1A is a component view of an embodiment of an LED light tube assembly.
Figure 1B:
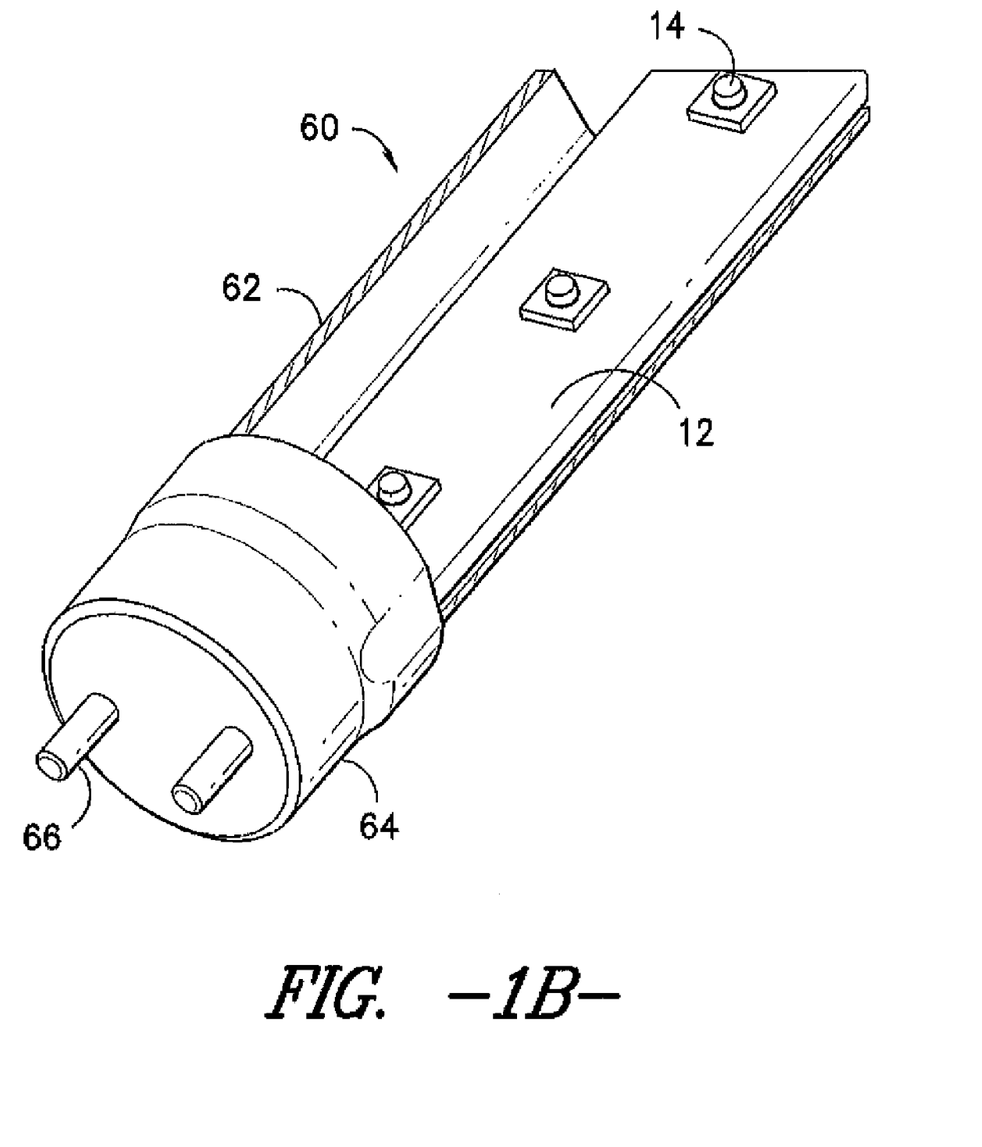
FIG. 1B is a partial assembled view of the LED light tube assembly of FIG. 1A.

FIGS. 1A and 1B illustrate a particular embodiment incorporating aspects of the invention. An LED light assembly 10 is illustrated in FIG. 1A. This assembly 10 includes a plurality of individual LED printed circuit boards (PCB) 12. Each of these boards 12 includes at least one LED bulb 14. In the illustrated embodiment, each board 12 includes four bulbs 14. The boards 12 may be manufactured so as to have a standard length, number of bulbs, and other standard dimensions. In this manner, a manufacturer need not manufacture and stock different size LED PCBs 12, which is a significant cost and manufacturing advantage.

Each of the boards 12 includes a first end 16 and an opposite second 18. Each of the ends 16, 18 includes a connector pad footprint that incorporates a number of connector pads 22. These pads 22 may be defined on an extension 20 of a main section of the board 12, with the extension 20 defining the extreme ends of the board 12. In an alternative embodiment, the connector pads 22 may be configured across the entire dimension of the main section of the board 12 without the extension member 20. The connector pads 22 serve to electrically connect and supply electric power to the bulbs 14 mounted on the board 12.

Figure 7:
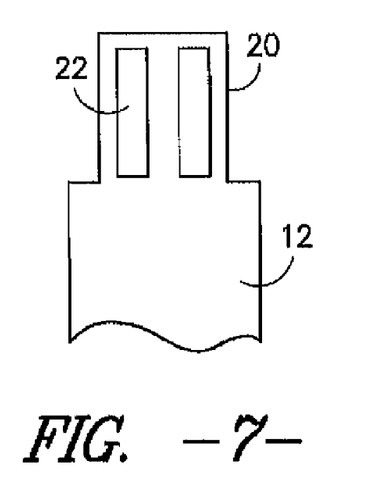
FIG. 7 is a top view of an end of a LED PCB illustrating the connector pads.

A more detailed view of an end of a board 12 is given in FIG. 7. In this view, the extension 20 incorporates two individual connector pads 22. These pads may be made of any conventional and suitable conductive material. For example, in a particular embodiment, the pads 22 are tin plated members. As in FIG. 7, dimensions are provided in certain of the figures for illustrative purposes only. It should be readily appreciated that size and dimensions are not limiting factors of the invention, and that the invention may be configured with different dimensions and sizes depending on the particular end product in which the components will be used.

Figure 4:
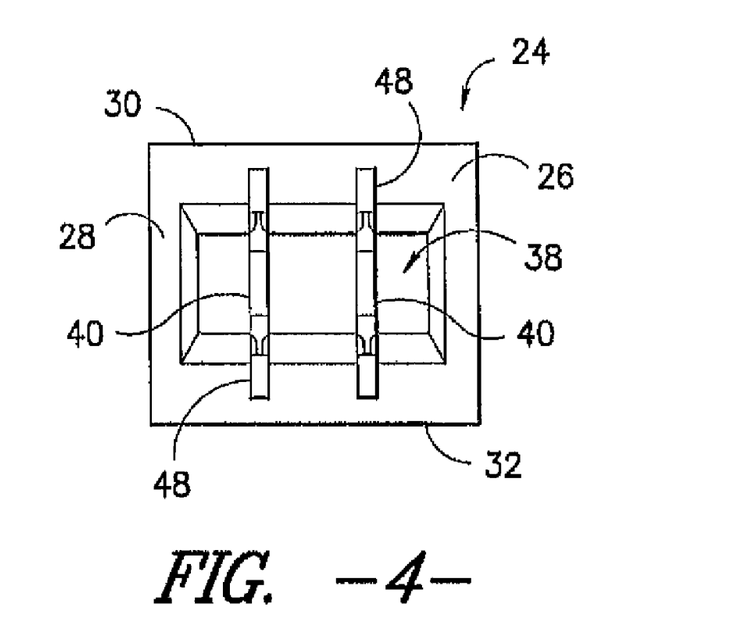
FIG. 4 is an end view of the an embodiment of an LED PCB connector.

Referring again to FIG. 1A, a connector 24 is provided between adjacent LED PCBs 12. This connector 24 can take on various configurations and serves to interconnect adjacent boards 12 in an end-to-end configuration. In a particular embodiment illustrated in the figures, the electrical connector 24 includes an insulative body 26 formed of any suitable insulative material, such as nylon 46. Other materials are well known to those skilled in the art and may be used in a connector 24 of the present invention. The body 26 has opposite aligned open ends 38, as seen in FIG. 4. In this manner, the body 26 may have an open-ended, box or channel-like shell configuration 28 wherein a passage is formed completely through the shell 28.

Figure 2A:
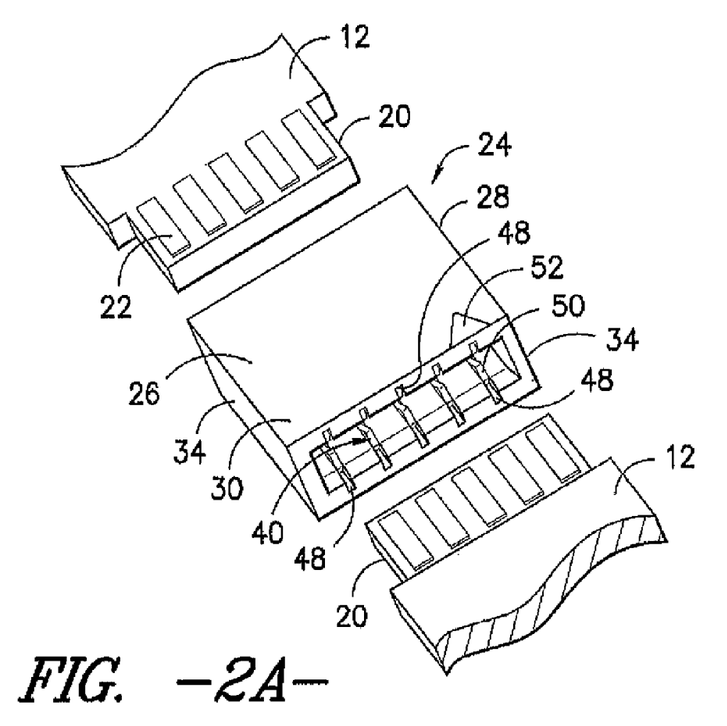
FIG. 2A is a component view of an embodiment of an electrical connector and LED PCB assembly in accordance with aspects of the invention.

A plurality of electrical contacts 40 are held in body 26 of the connector 24. These contacts may be made of any suitable material, such as tin plated copper alloy. The contacts 40 are spaced apart a distance that corresponds to the separation distance of the connector pads 22 at the ends of the LED PCBs 12, as particularly seen in FIG. 2A. Each of the contacts 40 electrically engages against an individual connector pad 22 of one LED PCB, and electrically connects the respective pad 22 to an aligned pad 22 of an adjacent LED PCB, as particularly illustrated in FIGS. 2A and 2B. It should be appreciated that any number of contacts may be configured in the body 26 depending on the contact footprint and pad footprint on the respective LED PCBs 12. For example, in FIGS. 2A and 2B, the connector 24 includes five contacts 40 that electrically mate with five respective connector pads 22 on each of the boards 12. This configuration may be referred to in the art as a 5-way connector. In the embodiment illustrated in FIG. 4, two contacts 40 are retained in the body 26 in a 2-way connector 24. In the embodiment illustrated in FIG. 1A, the connector 24 would be a 4-way connector with four individual contacts 40 to match the corresponding four connector pads 22 on the ends of the boards 12. It should thus be appreciated that the connectors 24 are not limited by the number of contact elements or end use configuration.

Figure 3:
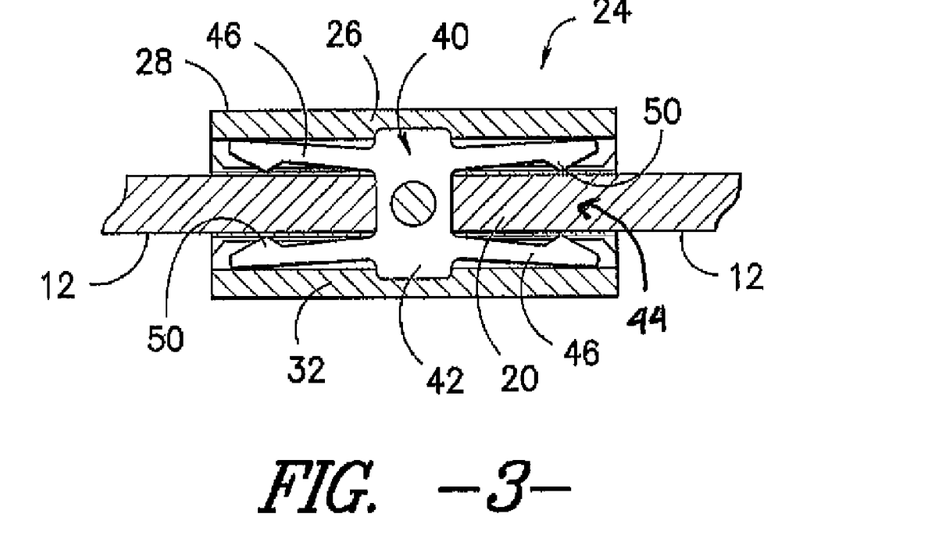
FIG. 3 a cut-away side view of the assembled components of FIG. 2B.

The contacts 40 retained in the connector body 26 may take on various shapes and configurations. In a particularly unique embodiment illustrated for example in FIG. 3, each contact element 40 is a blade-like member and includes a center beam or post component 42. A pair of contact arms 46 extends from the center beam 42 in opposite longitudinal directions, with each pair of arms 46 defining a receipt channel 44 for receipt of the extension 20 of the board 12 having the connector pads 22 thereon, as particularly illustrated in FIG. 3. Each of the arms 46 may include a barb 50 having an angled front face, as particularly illustrated in FIG. 3. Each of the arms 46 may be biased into the receipt channel 44 to provide a more positive and secure engagement against the connector pads 22. With this configuration, the angled front face of the barbs 50 aids with insertion of the end 20 of the board 12 into the receipt channel 44.

Each of the contacts 40 may be retained in the body 26 of the connector 24 in various ways. In the illustrated embodiment, slots 48 are machined or otherwise formed in the inside surfaces of the top 30 and bottom 32 of the body 26, as particularly seen in FIG. 2A. These slots 48 are open at one of the ends of the body 26 for insertion of the contacts 40 into the body 26. The open front face of the slots 48 is readily seen in FIG. 2A. The slots 48 have a width that corresponds generally to the thickness of the blade-like contacts 40. The slots 48 may be dead-ended at the opposite end of the body 26 so that the contacts 40 cannot be pushed completely through the body 26.

With the slot configuration discussed above, it is preferably that a board 12 is inserted first into the longitudinal end of the connector 24 having the open ended face of the slots 48. By inserting a board 12 into this end first, the individual contacts 40 are forced completely into the body 26 against the dead-end of the slots 48 at the opposite end of the body 26 and, thus, cannot be displaced from the connector body 26. After a board 12 is inserted into this end, then another board 12 can be inserted into the opposite end of the connector 24. In this regard, it may be desired to provide a mark or other indication 52 on the top 30 or bottom 32 of the connector body 26, with this mark 52 providing a positive indication as to the first end of the connector 24 for insertion of an LED PCB 12 in a subsequent assembly process. This mark 52 may be any manner of engraving, stamp, indentation, and the like.

It should be appreciated that the individual contacts may be retained in the insulative body 26 of the connector 24 by any other suitable means. For example, the contacts 40 may be directly molded into the body 26, or retained by other mechanical means.

Figure 2B:
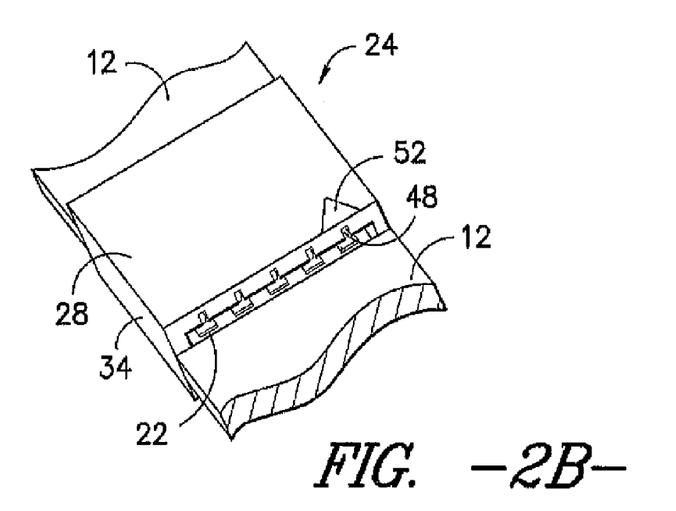
FIG. 2B is an assembled view of the components of FIG. 2A.

Referring to FIG. 2B, it can be seen that the electrical connector 24 between the adjacent LED PCBs 12 allows for minimal spacing between the boards, and thus a defined uniform spacing between the LED bulbs 14 of adjacent boards 12. The center beam component 42 of the individual contacts 40 essentially defines the separation distance between the ends of the adjacent LED PCBs 12. In a particular embodiment, the center beam 42 has a longitudinal length of between 1 mm and 5 mm such that in an assembled state, the adjacent ends of the LED PCBs 12 are spaced apart a minimal distance equal to between about 1 mm and 5 mm.

Figure 5:
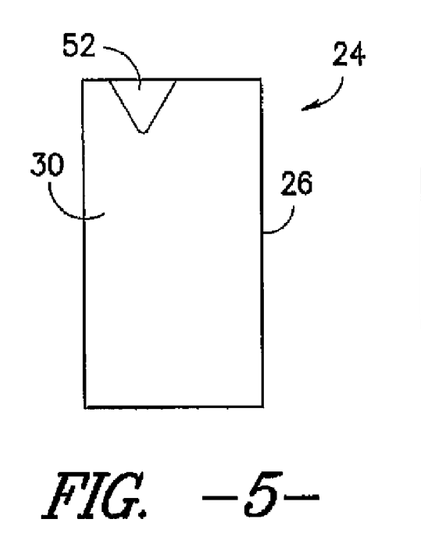
FIG. 5 is a top view of the insulative body component of the LED PCB connector of FIG. 4.
Figure 6:
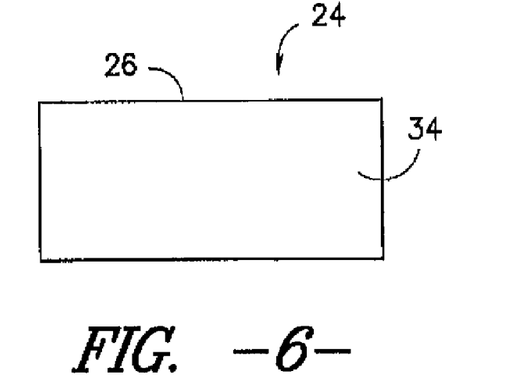
FIG. 6 is a side view of the insulative body component of the LED PCB connector of FIG. 4.

FIGS. 5 and 6 are a top and side view of the body 26 in the illustrated connector 24. As depicted in these and the other figures, the body 26 may have a box or channel-like shell structure 28 defining an internal passage therethrough, as particularly illustrated in FIG. 4.

The present invention also encompasses an LED light tube assembly 60, as particularly illustrated in FIGS. 1A and 1B. This assembly 60 includes a light tube 62 that may be, for example, glass, plastic, or any other type of suitable clear or translucent material. The assembly 60 includes an end cap connector 64 at opposite ends of the tube 62. Each of these connectors 64 includes any manner of external electrical connection component, such as pins 66. These pins 66 engage into a power supply socket in a conventional light fixture, such as any manner of conventional fluorescent light fixture. A plurality of LED PCBs 12 are connected in an end-to-end configuration within the light tube 62, as conceptually illustrated in FIG. 1A wherein two boards 12 are illustrated. The connector pads 22 on the extreme ends of the connected boards 12 engage in a corresponding socket or other connector component within the end cap connectors 64. Thus, in this manner, a complete electrical circuit is defined from one end cap connector 64, through the interconnected boards 12, and to the opposite end cap connector 64.

Referring again to FIG. 1A, it should be appreciated that various sizes and power ratings for a light tube assembly 60 can be easily manufactured and assembled using a standard size LED PCB, end cap connectors 64, and board connectors 24. Only the length of the light tube 62 would need to vary to accommodate an increased or decreased number of LED PCBs 12. The light tube assembly 60 particularly illustrated in FIG. 1A is unique in that it resembles a conventional fluorescent light bulb and can be readily configured for receipt in an existing fluorescent light fixture. Thus, the LED light tube assembly 60 can act as a replacement bulb for existing fluorescent light fixtures.

It should also be readily appreciated that the invention also encompasses an electrical connector 24 configured for connecting adjacent ends of LED PCBs 12 within a light tube 62 or other type of light fixture, as described above.

It should be readily appreciated by those skilled in the art that various modifications and variations can be made to the present invention without departing from the scope and spirit of the invention as set forth in the claims and their equivalents.

What is claimed is:

1. An LED light assembly, comprising:
   a plurality of LED printed circuit boards (PCB), each said LED PCB having at least one LED bulb and electrical connector pads configured at each opposite end of said LED PCBs;
   at least one electrical connector connecting one end of a first LED PCB to an end of a second said LED PCB such that said first and second LED PCBs are electrically connected end-to-end; and
   said electrical connector comprising a plurality of electrical contacts having a center beam and opposite receipt channels extending in opposite directions from said center beam, said receipt channels defined by opposed pairs of contact arms extending transversely from said center beam, each of said opposed contact arms having a contact barb defined thereon at a position to slide against and remain in electrical contact with said connector pads of an end of a said LED PCB inserted into said receipt channel.

2. The LED light assembly as in claim 1, wherein said electrical connector further comprises:
an insulative body having opposite open longitudinal ends, said electrical contacts held in said insulative body and spaced apart a distance corresponding to a separation distance of said connector pads at said ends of said LED PCBs; and
wherein said insulative body comprises a shell having a closed top, closed bottom, sides, and a passage therethrough extending between said open longitudinal ends of said body, said top and bottom extending to said open longitudinal ends, said electrical contacts fitted into said shell such that each of said top and bottom extend at least to ends of said contact arms at said respective open longitudinal ends.

3. The LED light assembly as in claim 2, wherein said electrical contacts are fitted into slots defined in an inner surface of said top and bottom of said shell.

4. The LED light assembly as in claim 3, wherein said slots are open at one of said longitudinal ends of said shell for insertion of said electrical contacts, and further comprising an indication mark on an outer surface of said shell that provides an indication of said respective longitudinal end having said open end of said slots.

5. The LED light assembly as in claim 1, wherein said contact arms are biased into said receipt channel.

6. The LED light assembly as in claim 1, wherein said electrical contacts are molded into insulative body.

7. The LED light assembly as in claim 1, wherein said center beam of said electrical contacts has a longitudinal length of between 1 mm and 5 mm such that in an assembled state, adjacent ends of said LED PCBs are spaced apart a minimal distance equal to said length of said center beam.

8. An LED light tube assembly configured for receipt in a lighting fixture, comprising:
a light tube having an end cap connector at each opposite longitudinal end thereof
a plurality of LED printed circuit boards (PCB) connected in an end-to-end configuration within said light tube, each said LED PCB having at least one LED bulb and electrical connector pads configured at each opposite end of said LED PCBs, said electrical connector pads of said extreme opposite ends of said connected LED PCBs in electrical mating contact with said end cap connectors; and
an electrical connector connecting said connector pads of aligned ends of adjacent said LED PCBs within said light tube such that one end of a first LED PCB is in electrical contact to an end of a second said LED PCB, wherein said electrical connectors further comprise:
an insulative body having a closed to and closed bottom extending to opposite open longitudinal ends of said body, and a plurality of electrical contacts held in said insulative body and spaced apart a distance corresponding to a separation distance of said connector pads at said ends of said LED PCBs;
each said electrical contact having oppositely extending receipt channels that extend in opposite directions to a respective said open longitudinal end of said insulative body, said receipt channels defined by opposed pairs of contact arms, said contact arms disposed in slots defined in an inner surface of said closed top and closed bottom of said insulative body, said slots extending at least to ends of said contact arms.

9. The LED light tube assembly as in claim 8, wherein said assembly is configured for receipt in a fluorescent light fixture, said end cap connectors comprising pin contacts configured for receipt in receptacles in said fluorescent light fixture.

10. The LED light tube assembly as in claim 8, wherein said LED PCBs have a standard uniform length, and whereby assemblies of varying length and power are configured by connecting more or less of said LED PCBs within said light tube.

11. The LED light tube assembly as in claim 8, wherein said slots are open at one of said longitudinal ends of said shell for insertion of said electrical contacts, and further comprising an indication mark on an outer surface of said shell that provides an indication of said respective longitudinal end having said open slots.

12. The LED light tube assembly as in claim 8, wherein said opposed pairs of contact arms each comprise barbs on disposed to slide against and remain in electrical contact with said connector pads of said LED PCB inserted into said receipt channels.

13. The LED light tube assembly as in claim 12, wherein said contact arms are biased into said receipt channel.

14. The LED light assembly as in claim 8, wherein said electrical contacts are molded into insulative body.

15. An electrical connector configured for connecting adjacent ends of LED PCBs within an LED light assembly, the LED PCBs having at least one LED bulb and a plurality of electrical contact pads at each end thereof, said connector comprising:
an insulative body having opposite aligned open ends, and at least two electrical contacts held in said insulative body, said contacts spaced apart a distance corresponding to a separation distance of said connector pads at said ends of said LED PCBs;
each said electrical contact having a center beam and opposite receipt channels extending in opposite directions from said center beam to respective said open ends of said insulative body, said receipt channels defined between opposed pairs of contact arms extending transversely from said center beam, said contact arms configured to electrically engage against said connector pads of an end of a said LED PCB inserted into said open end of said insulative body;
said insulative body comprising a shell having a closed top, closed bottom, sides, and a passage therethrough extending between open longitudinal ends of said body, said top and bottom extending to said open longitudinal ends, each of said opposed contact arms fitted into slots defined in an inner surface of said top and bottom of said shell, said slots extending at least to ends of said contact arms.

16. The LED PCB connector as in claim 15, wherein said slots are open at one of said longitudinal ends of said shell for insertion of said electrical contacts, and further comprising an indication mark on an outer surface of said shell that provides an indication of said respective longitudinal end having said open slots.

17. The LED PCB connector as in claim 15, wherein said opposed pair of contact arms are biased into said receipt channel and include barbs disposed to slide against and remain in electrical contact with said connector pads of said LED PCB inserted into said receipt channels.

18. The LED PCB connector as in claim 15, wherein said electrical contacts are molded into insulative body.

19. The LED PCB connector as in claim 15, wherein said center beam of said electrical contacts has a longitudinal length of between 1 mm and 5 mm such that in an assembled state, adjacent ends of said LED PCBs are spaced apart a minimal distance equal to said length of said center beam.

* * * * *